United States Patent
Liu et al.

(10) Patent No.: US 10,524,373 B2
(45) Date of Patent: Dec. 31, 2019

(54) FIXING ASSEMBLY

(71) Applicant: WISTRON CORP., New Taipei (TW)

(72) Inventors: Yi Chien Liu, New Taipei (TW);
Po-Kai Wang, New Taipei (TW);
Yu-Hsin Yu, New Taipei (TW);
Jung-Shu Hsiao, New Taipei (TW);
Ching-Hua Wang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/122,790

(22) Filed: Sep. 5, 2018

(65) Prior Publication Data
US 2019/0307012 A1 Oct. 3, 2019

(30) Foreign Application Priority Data
Mar. 30, 2018 (TW) .............................. 107111331 A

(51) Int. Cl.
*H05K 7/02* (2006.01)
*H05K 7/04* (2006.01)
*H05K 7/14* (2006.01)
*H05K 5/02* (2006.01)
*G06F 1/18* (2006.01)

(52) U.S. Cl.
CPC ......... *H05K 7/1417* (2013.01); *H05K 5/0217* (2013.01); *H05K 7/1494* (2013.01); *G06F 1/185* (2013.01); *G06F 1/186* (2013.01)

(58) Field of Classification Search
USPC ....................................................... 361/810
See application file for complete search history.

(56) References Cited

U.S. PATENT DOCUMENTS

| | | | | |
|---|---|---|---|---|
| 6,870,744 | B2* | 3/2005 | Kosugi | G06F 1/184 211/41.17 |
| 6,885,565 | B2* | 4/2005 | Shi | G06F 1/184 361/732 |
| 2009/0067136 | A1* | 3/2009 | Cheney | G06F 1/185 361/726 |
| 2016/0327995 | A1* | 11/2016 | Sun | G06F 1/185 |

FOREIGN PATENT DOCUMENTS

| | | |
|---|---|---|
| CN | 103517592 A | 1/2014 |
| CN | 205750684 U | 11/2016 |
| TW | M408064 U | 7/2011 |
| TW | I583288 B | 5/2017 |

* cited by examiner

*Primary Examiner* — Hung S. Bui
(74) *Attorney, Agent, or Firm* — Maschoff Brennan

(57) ABSTRACT

The disclosure provides a fixing assembly adapted to fix an expansion card on an expansion slot of a motherboard. The fixing assembly includes a casing, a first positioning component and a second positioning component. The first positioning component is slidably disposed on the casing so that a distance between the first positioning component and the expansion slot of the motherboard is adjustable. The second positioning component is slidably disposed on the first positioning component. The second positioning component and the first positioning component are configured to press against the expansion card, and sliding directions of the first positioning component and the second positioning component are different from each other.

20 Claims, 14 Drawing Sheets

FIXING ASSEMBLY

CROSS-REFERENCE TO RELATED APPLICATIONS

This non-provisional application claims priority under 35 U.S.C. § 119(a) on Patent Application No(s). 107111331 filed in Taiwan, R.O.C. on Mar. 30, 2018, the entire contents of which are hereby incorporated by reference.

TECHNICAL FIELD

The disclosure relates to a fixing assembly, more particularly to a fixing assembly which is able to press against an expansion card in multiple directions.

BACKGROUND

With the development of computer technology, electronic products such as computers have been widely used in daily life. In order to meet various requirements of consumers, there are a plurality of expansion slots on a motherboard that can hold expansion cards (e.g., graphic cards) to expand the functionality of the computer.

To a brand computer, expansion cards have been already inserted in the expansion slots during manufacturing. Thus, while shipping the computer, the shipping box for accommodating the computer might be knocked around or shaken, causing the expansion card to sway with respect to the motherboard. Such undesired movement of the expansion card would loosen the expansion card itself, resulting in poor connection between the expansion card and the motherboard. This affects the high performance expansion card even more. In detail, the high performance expansion card is usually equipped with a bigger heat dissipation device, thus the overall volume and weight of the expansion card are increased, thereby causing the expansion card to sway more seriously or even to be detached from or to damage the expansion slot.

SUMMARY OF THE INVENTION

One embodiment of the disclosure provides a fixing assembly adapted to fix an expansion card on an expansion slot of a motherboard. The fixing assembly includes a casing, a first positioning component and a second positioning component. The first positioning component is slidably disposed on the casing so that a distance between the first positioning component and the expansion slot of the motherboard is adjustable. The second positioning component is slidably disposed on the first positioning component. The second positioning component and the first positioning component are configured to press against the expansion card, and sliding directions of the first positioning component and the second positioning component are different from each other.

BRIEF DESCRIPTION OF THE DRAWINGS

The present disclosure will become better understood from the detailed description given herein below and the accompanying drawings which are given by the way of illustration only and thus are not intending to limit the present disclosure and wherein.

DETAILED DESCRIPTION

Figure 1:
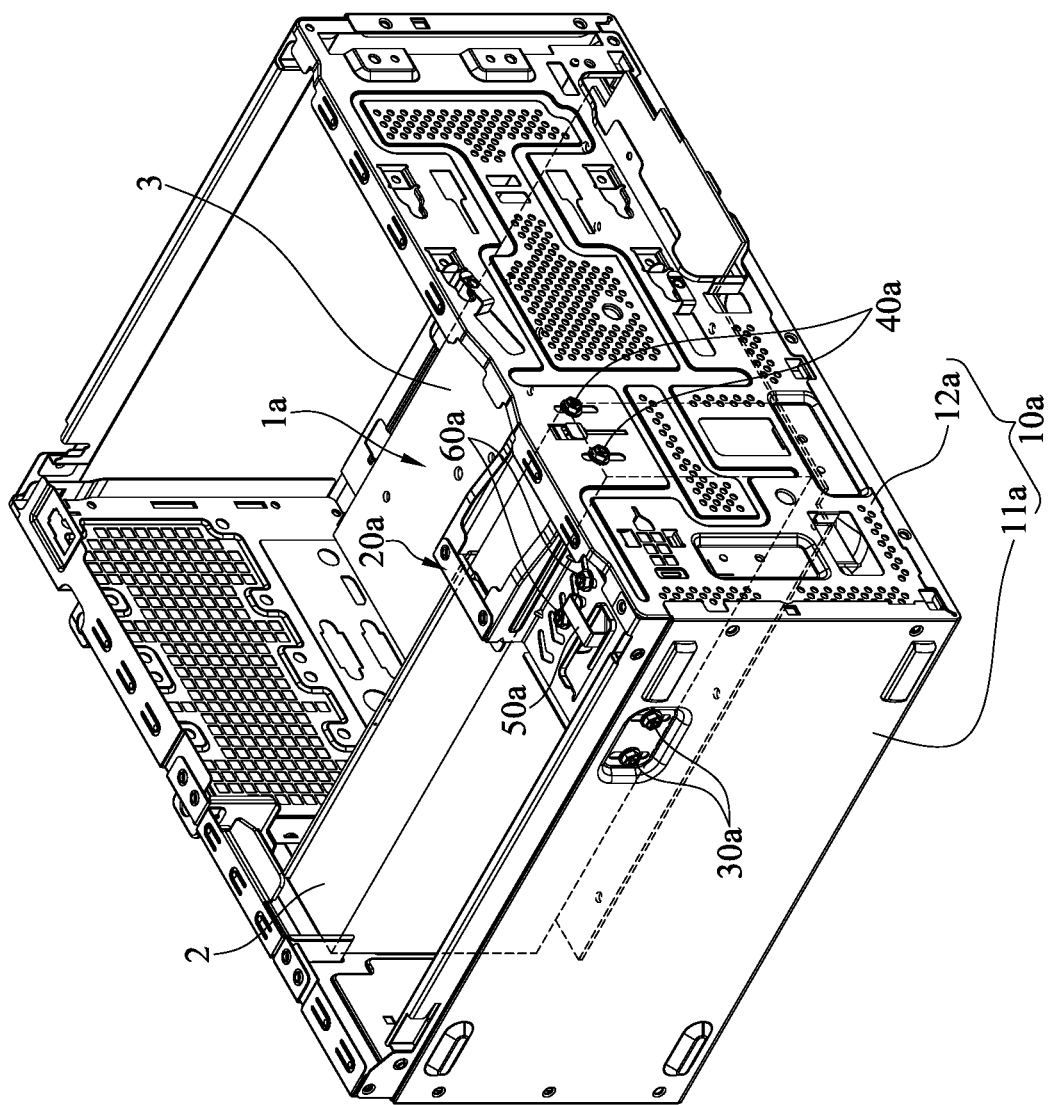
FIG. 1 is a perspective view of a fixing assembly according to a first embodiment of the disclosure which fixes an expansion card in position.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
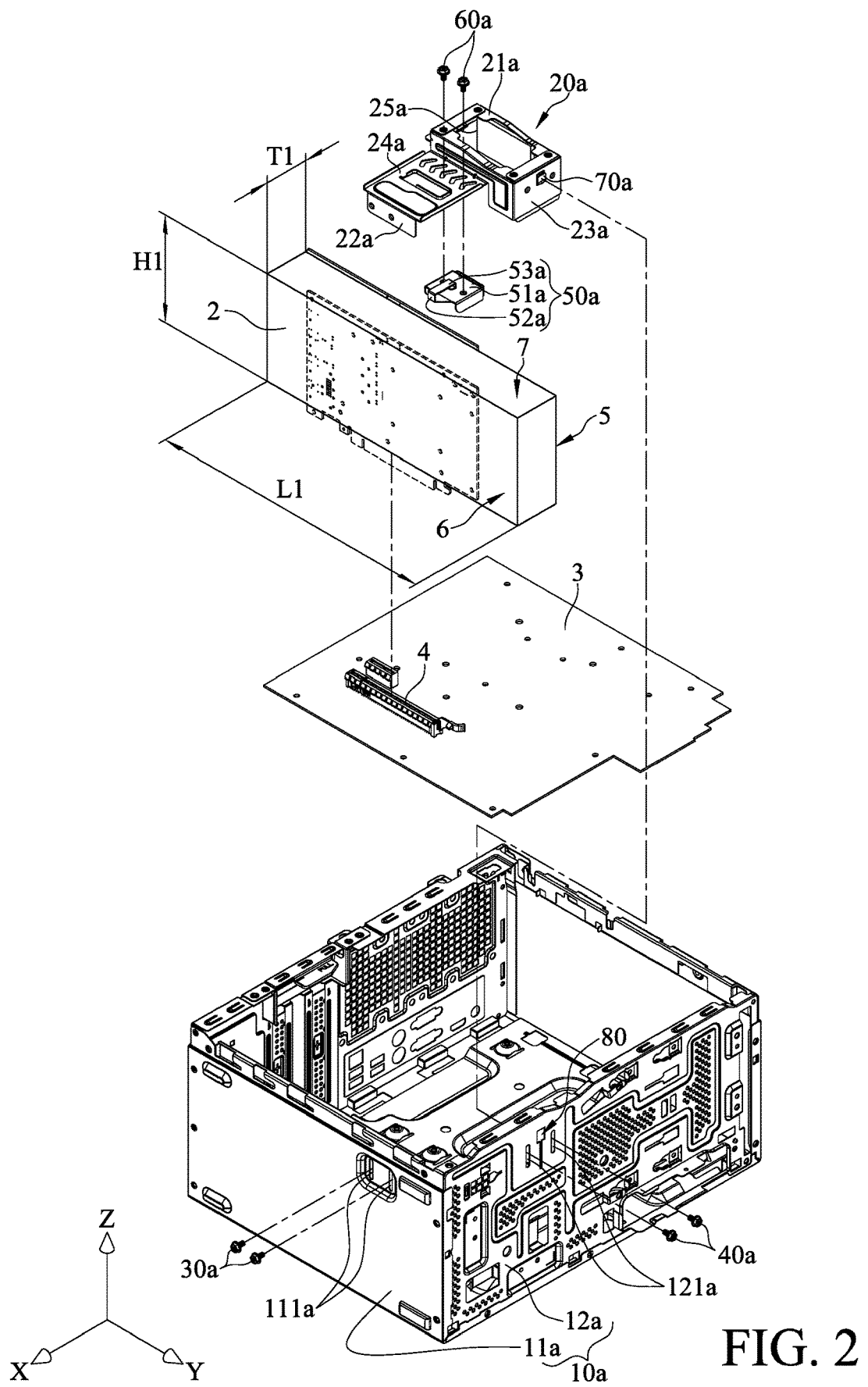
FIG. 2 is an exploded view of the fixing assembly and the expansion card in FIG. 1.

Please refer to FIG. 1 and FIG. 2, FIG. 1 is a perspective view of a fixing assembly according to a first embodiment of the disclosure which fixes an expansion card in position, and FIG. 2 is an exploded view of the fixing assembly and the expansion card in FIG. 1.

This embodiment provides a fixing assembly 1a. The fixing assembly 1a includes a casing 10a, a first positioning component 20a, four first fasteners 30a and 40a, a second positioning component 50a and two second fasteners 60a. The casing 10a includes a first plate 11a and a second plate 12a. The first plate 11a and the second plate 12a are intersected each other; that is, an edge of the first plate 11a is connected to an edge of the second plate 12a. The first plate 11a is, for example, a bottom plate of a computer casing, and the second plate 12a is, for example, a front plate of the computer casing. In this embodiment, the fixing assembly 1a is, for example, adapted to fix an expansion card 2 on an expansion slot 4 of a vertical motherboard 3, and the expansion card 2 fixed by the fixing assembly 1a is, for example, a double-layer graphic card. The expansion card 2 has a top surface 5, a bottom surface 6 and a lateral surface 7. When the expansion card 2 is inserted in the expansion slot 4, the bottom surface 6 faces the first plate 11a, the top surface 5 is opposite to the bottom surface 6 and far away from the first plate 11a than the bottom surface 6, and the lateral surface 7 is located between the top surface 5 and the bottom surface 6 and is also located at a side of the expansion card 2 away from the expansion slot 4. In order to clearly illustrate each element of the fixing assembly 1a, a 3D coordinate system is provided. A normal direction of the bottom surface 6 is parallel to the X-axis direction, a long side of the expansion card 2 is parallel to the Y-axis direction, and a normal direction of the lateral surface 7 is parallel to the Z-axis direction. As such, the expansion card 2 has a thickness T1 in the X-axis direction, a length L1 in the Y-axis direction, and a height H1 in the Z-axis direction.

Figure 4:
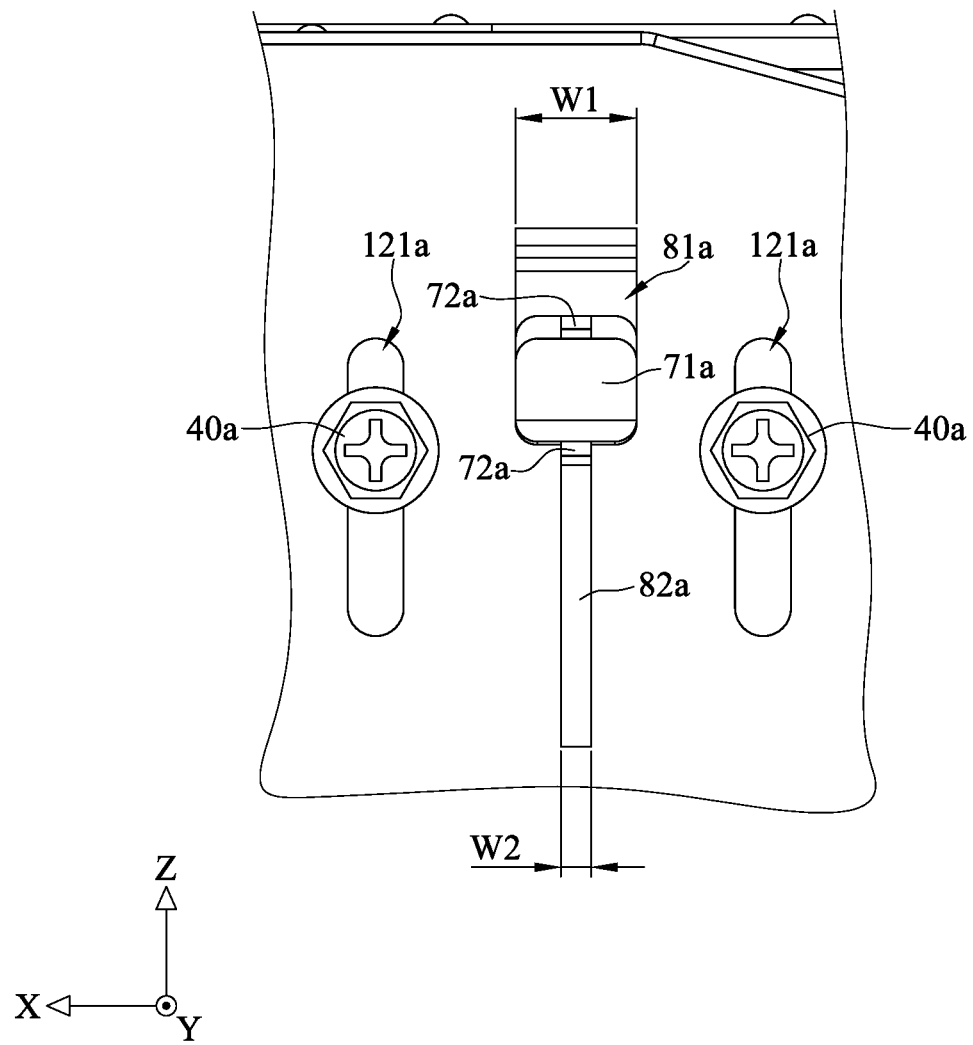
FIG. 4 is a partial side view of the fixing assembly and the expansion card in FIG. 1.
Figure 5:
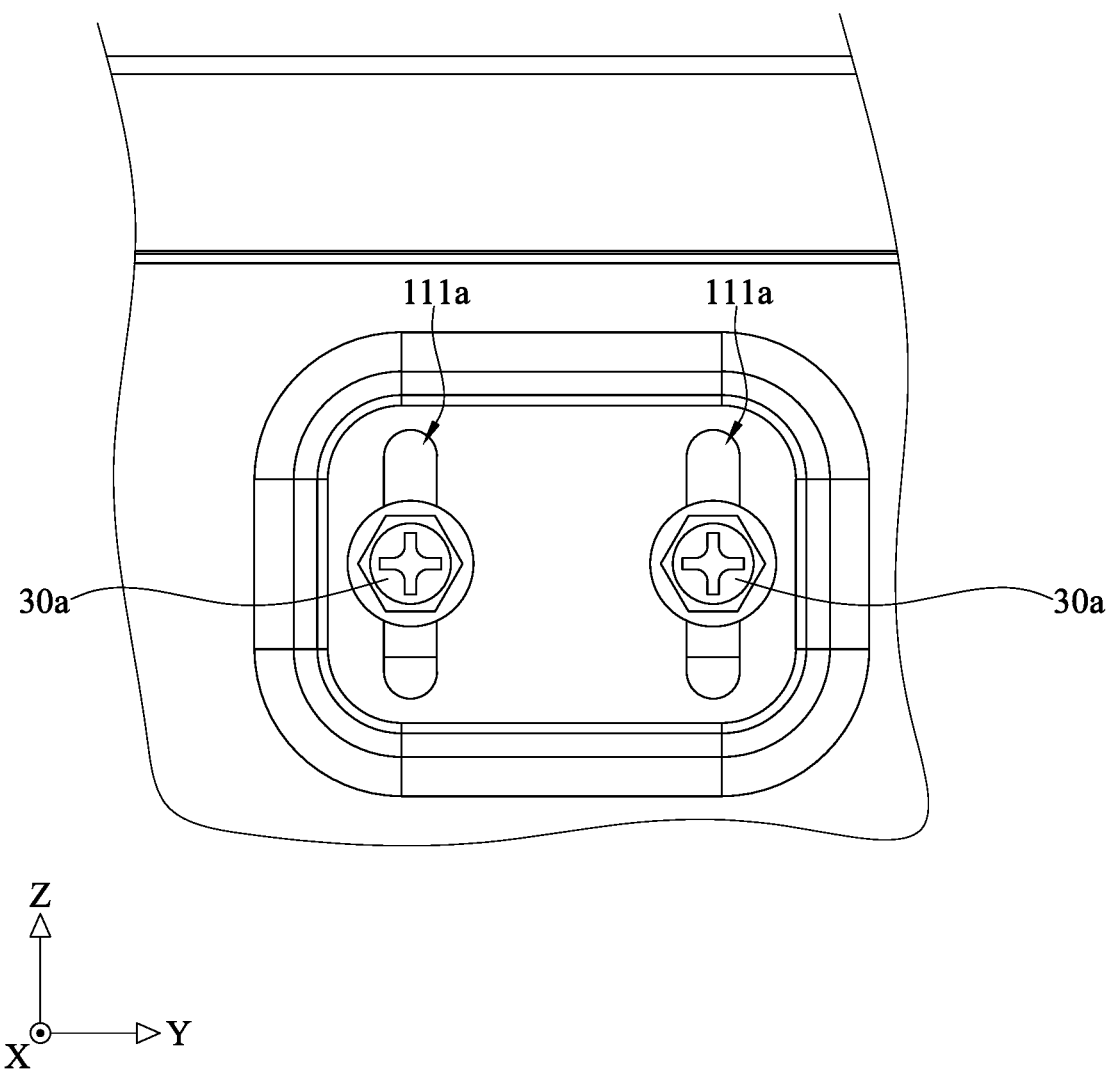
FIG. 5 is another partial side view of the fixing assembly and the expansion card in FIG. 1.

Then, the following paragraphs will continually illustrate the fixing assembly 1a of this embodiment. Please refer to FIG. 2 to FIG. 5, FIG. 3 is a top view of the fixing assembly and the expansion card in FIG. 1, FIG. 4 is a lateral view of the fixing assembly and the expansion card in FIG. 1, and FIG. 5 is another partial side view of the fixing assembly and the expansion card in FIG. 1.

Each of the first plate 11a and the second plate 12a has two first adjusting slots 111a and 121a. Each of the first adjusting slots 111a and 121a is, for example, a slot extending in a straight direction. In addition, an extension direction of each of the first adjusting slots 111a and 121a is the same as an inserting direction that the expansion card 2 is inserted in the expansion slot 4 of the motherboard 3. In other words, the extension directions of the two first adjusting slots 111a and the extension directions of the two first adjusting slots 121a are parallel to the Z-axis direction. The purpose of the first adjusting slots 111a and 121a will be described in the later paragraphs.

The first positioning component 20a includes a positioning portion 21a, two first mounting portions 22a and 23a, a second mounting portion 24a and a stopping portion 25a. The first mounting portion 23a and the second mounting portion 24a are respectively connected to different sides of the positioning portion 21a. The stopping portion 25a is connected to the positioning portion 21a, and the stopping portion 25a and the second mounting portion 24a are respectively located on two opposite sides of the positioning portion 21a. The first mounting portion 22a is connected to a side of the second mounting portion 24a away from the positioning portion 21a. The two first fasteners 30a are respectively disposed through the two first adjusting slots 111a and are detachably fixed to the first mounting portion 22a, and the two first fasteners 40a are respectively disposed through the two first adjusting slots 121a and are detachably fixed to the first mounting portion 23a so as to adjust a distance between the first positioning component 20a and the expansion slot 4 of the motherboard 3.

In this embodiment, the first fasteners 30a and 40a are, for example, screws, and the first adjusting slots 111a and 121a respectively extend in a straight direction, but the present disclosure is not limited thereto. In some other embodiments, the first fasteners may be plugs, and each of the first adjusting slots may be replaced with a plurality of through holes.

The second mounting portion 24a of the first positioning component 20a has a plurality of second adjusting slots 241a-245a, and the second adjusting slots 241a-245a are arranged along the long side of the expansion card 2 when the expansion card 2 is inserted in the expansion slot 4. That is, the second adjusting slots 241a-245a are arranged in the Y-axis direction. In addition, each of the second adjusting slots 241a-245a extends in the X-axis direction; that is, an extension direction of each of the second adjusting slots 241a-245a is different from the extension direction of the first adjusting slot 111a. In detail, each of the second adjusting slots 241a-245a includes a first extension part 246a and a second extension part 247a connected to each other. The first extension part 246a and the second extension part 247a of each of the second adjusting slots 241a-245a form an obtuse angle θ1. The first extension part 246a of each of the second adjusting slots 241a-245a respectively forms an acute angle θ2 with a reference line P which is parallel to the X-axis direction. The second extension part 247a of each of the second adjusting slots 241a-245a respectively forms an acute angle θ3 with the reference line P. In other words, the first extension part 246a and the second extension part 247a of each of the second adjusting slots 241a-245a are inclined.

In this embodiment, the first plate 11a has two first adjusting slots 111a, but the present embodiment is not limited thereto. In some other embodiments, the first plate may have only one first adjusting slot. As such, it only requires one first fastener to be disposed through the first adjusting slot and to be fixed to the first mounting portion. The quantities of the first adjusting slots of the second plate and the first fasteners which are fixed to the other first mounting portion may be adjusted according the same manner.

The second positioning component 50a includes a pressing portion 51a, a connecting portion 52a and a clamping portion 53a. Two opposite ends of the connecting portion 52a are respectively connected to the pressing portion 51a and the clamping portion 53a, and the pressing portion 51a and the clamping portion 53a extend toward the same direction. The second positioning component 50a penetrates through the second mounting portion 24a of the first positioning component 20a, and the pressing portion 51a is closer to the motherboard 3 than the clamping portion 53a. The pressing portion 51a and the clamping portion 53a together clamp the second mounting portion 24a, and the pressing portion 51a and the stopping portion 25a of the first positioning component 20a are respectively configured to press against the bottom surface 6 and the top surface 5 of the expansion card 2. The two second fasteners 60a are respectively disposed through the first extension parts 246a or the second extension parts 247a of the second adjusting slots 243a, 245a, and are detachably fixed to the pressing portion 51a of the second positioning component 50a.

In this embodiment, the fixing assembly 1a further includes a first guiding structure 70a and a second guiding structure 80a. The first guiding structure 70a is disposed on the first mounting portion 23a, and the second guiding structure 80a is disposed on the second plate 12a. The cooperation of the first guiding structure 70a and the second guiding structure 80a restricts the first positioning component 20a only movable along the Z-axis direction to adjust the distance from the expansion slot 4 so as to provide a pre-positioning effect. In detail, the first guiding structure 70a includes a mounting block 71a and two guiding blocks 72a. The two guiding blocks 72a are respectively connected to two opposite ends of the mounting block 71a, and the two guiding blocks 72a are connected to the first mounting portion 23a. The second guiding structure 80a is located on the second plate 12a, and an extension direction of the second guiding structure 80a is the same as the extension directions of the two first adjusting slots 121a. The second guiding structure 80a includes a mounting hole 81a and a guiding slot 82a connect to each other. A width W1 of the mounting hole 81a is larger than a width W2 of the guiding slot 82a. The mounting block 71a of the first guiding structure 70a is detachably disposed through the mounting hole 81a, and the two guiding blocks 72a are slidably located in the guiding slot 82a.

Then, the following paragraphs will illustrate the mounting process of the fixing assembly 1a under a condition that the expansion card 2 is inserted in the expansion slot 4. Firstly, the mounting block 71a is disposed through the mounting hole 81*a* so that the two guiding blocks 72*a* are located in the guiding slot 82*a*. Then, the first positioning component 20*a* is moved in the Z-axis direction until the positioning portion 21*a* of the first positioning component 20*a* presses against the lateral surface 7 of the expansion card 2. Then, the two first fasteners 30*a* are fixed to the first mounting portion 22*a*, and the two first fasteners 40*a* are fixed to the first mounting portion 23*a*. Then, the second mounting portion 24*a* is clamped by the pressing portion 51*a* and the clamping portion 53*a* of the second positioning component 50*a* so that the second positioning component 50*a* is positioned on the second mounting portion 24*a*. Then, the clamping portion 53*a* is moved in the X-axis direction and the Y-axis direction; that is, the clamping portion 53*a* is moved along the two second adjusting slots 243*a* and 245*a* so that the pressing portion 51*a* of the second positioning component 50*a* presses against an edge of the bottom surface 6 of the expansion card 2. Then, the two second fasteners 60*a* are respectively disposed through the first extension parts 246*a* or the second extension parts 247*a* of the two second adjusting slots 243*a* and 245*a* and then fixed to the pressing portion 51*a*.

In this embodiment, the positioning portion 21*a* presses against the lateral surface 7 of the expansion card 2 so that the expansion card 2 is prevented from being moved in the Z-axis direction while an external force causing the expansion card 2 to shake or move. This configuration helps to decrease the opportunity of the expansion card 2 being self-detached from the expansion slot 4 and damaging the expansion slot 4.

On the other hand, the pressing portion 51*a* presses against the bottom surface 6 of the expansion card 2 so as to provide a support for bearing the weight of the expansion card 2, thereby preventing the expansion card 2 or an overweight expansion card from sagging and damaging the expansion slot 4 and the motherboard 3. Also, the pressing portion 51*a* can press against the edge of the bottom surface 6 and thus can further enhance the support of the pressing portion 51*a* to the expansion card 2. Furthermore, the bottom surface 6 and the top surface 5 of the expansion card 2 are respectively pressed against by the pressing portion 51*a* and the stopping portion 25*a*, thus the expansion card 2 is prevented from being moved (e.g. shaking or swing) in the X-axis direction while an external force causing the expansion card 2 to shake or move. Hence, the pressing portion 51*a* and the stopping portion 25*a* help to further decrease the opportunity of the expansion slot 4 from being damaged by the expansion card 2.

In this embodiment, the configuration of the stopping portion 25*a* of the first positioning component 20*a* is not limited. In some other embodiments, the configuration of the stopping portion may be removed according to actual requirements.

Moreover, in this embodiment, the first extension parts 246*a* of the two second adjusting slots 243*a* and 245*a* are inclined, thus inclined edges of the two first extension parts 246*a* can respectively provide supports to the two second fasteners 60*a* which are fixed to the pressing portion 51*a* so as to share the burden of the pressing portion 51*a* in bearing the expansion card 2. In the same manner, when the two second fasteners 60*a* are respectively disposed through the two second extension parts 247*a* and then fixed to the pressing portion 51*a*, inclined edges of the second extension parts 247*a* will also provide supports against the weight of the expansion card 2.

In the aforementioned process of mounting the second positioning component 50*a* onto the second mounting portion 24*a*, since the clamping portion 53 and the pressing portion 51*a* of the second positioning component 50*a* together clamp the second mounting portion 24*a*, the second positioning component 50*a* can be pre-positioned on the second mounting portion 24*a*. This configuration helps to adjust a position where the pressing portion 51*a* presses against the expansion card 2. In addition, the clamping portion 53*a* is located on the side of second mounting portion 24*a* away from the expansion slot 4, which is convenient for a user to move the clamping portion 53*a* so as to adjust the position of the second positioning component 50*a*.

Figure 6:
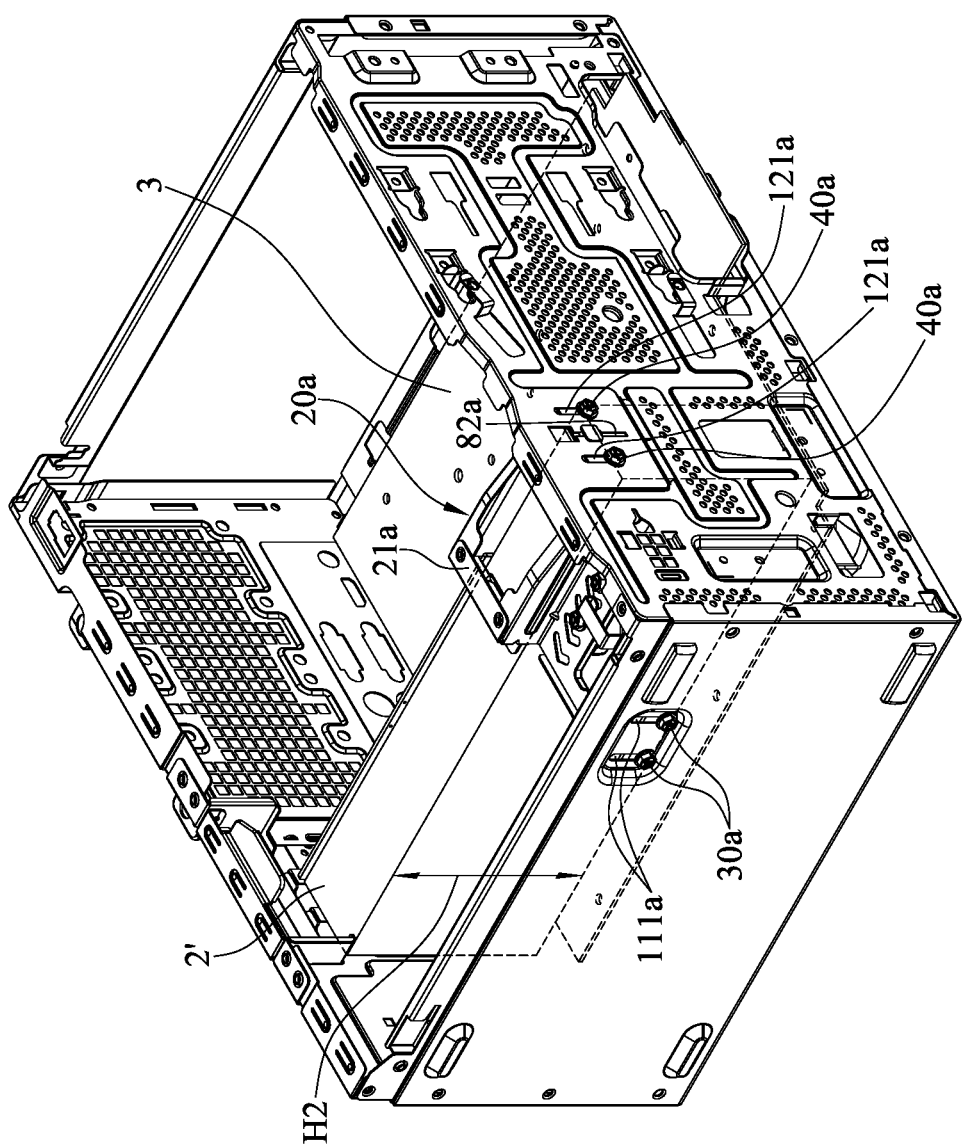
FIG. 6 is a perspective view of the fixing assembly in FIG. 1 when a shorter expansion card is fixed therein.

It is noted that the present disclosure is not limited to the size of the expansion card to be fixed in the fixing assembly 1*a*. For example, please refer to FIG. 6, FIG. 6 is a perspective view of the fixing assembly in FIG. 1 when a shorter expansion card is fixed therein.

When an user attempts to install an expansion card 2' which has a height H2 less than the height H1 of the expansion card 2 in FIG. 2, the first step is to slightly loosen the four first fasteners 30*a* and 40*a*, and then the first positioning component 20*a* is moved in the negative Z-axis direction with the help of the guiding slot 82*a* where the two guiding blocks 72*a* (e.g., as shown in FIG. 4) are located until the positioning portion 21*a* of the first positioning component 20*a* presses against the expansion card 2'. Lastly, the four first fasteners 30*a* and 40*a* are then tightly screwed on the first mounting portions 22*a* and 23*a* (e.g., as shown in FIG. 2). On the contrary, when the user attempts to replace the expansion card 2' with the expansion card 2; that is, replacing with a taller expansion card, the first step is still to slightly loosen the four first fasteners 30*a* and 40*a*, and then the first positioning component 20*a* is moved in the positive Z-axis direction to increase the distance between the first positioning component 20*a* and the motherboard 3 until the positioning portion 21*a* presses against the expansion card 2. It is understood that the height of the two first mounting portions 22*a* and 23*a* can be freely adjusted because the extension direction of each of the first adjusting slots 111*a* and 121*a* is parallel to the Z-axis direction, thus the distance between the first positioning component 20*a* and the motherboard 3 can be adjusted in accordance with the height of the expansion card, allowing the positioning portion 21*a* of the first positioning component 20*a* to press against the lateral surface of each of the expansion cards having different heights.

Figure 7:
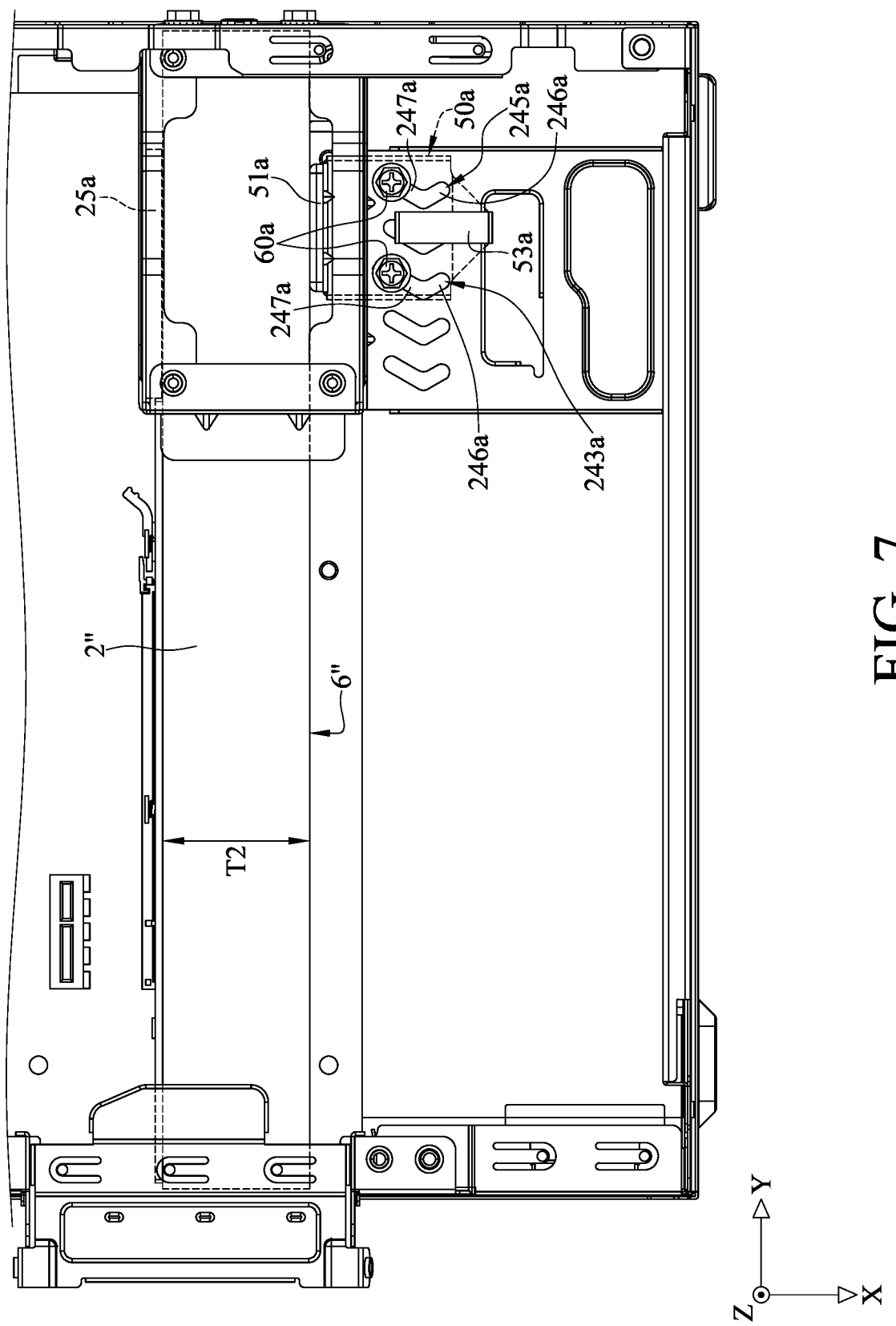
FIG. 7 is a top view of the fixing assembly in FIG. 1 when a thinner expansion card is fixed therein.

For another example, please refer to FIG. 7, FIG. 7 is a top view of the fixing assembly in FIG. 1 when a thinner expansion card is fixed therein.

When the user attempts install an expansion card 2" which has a thickness T2 less than the thickness T1 of the expansion card 2 in FIG. 2, the first step is to slightly loosen the two second fasteners 60*a*, and then the clamping portion 53*a* of the second positioning component 50*a* is moved so as to move the two second fasteners 60*a* toward the two second extension parts 247*a* of the second adjusting slots 243*a* and 245*a* along the edges of the two second adjusting slots 243*a* and 245*a* until the pressing portion 51*a* contacts or presses against the bottom surface 6" of the expansion card 2". Lastly, the two second fasteners 60*a* are then tightly screwed on the second positioning component 50*a*. On the contrary, when the user attempts to replace the expansion card 2" with the expansion card 2; that is, replacing with a thicker expansion card, the first step is still to slightly loosen the two second fasteners 60*a*, and then the clamping portion 53*a* of the second positioning component 50*a* is moved to increase a distance between the pressing portion 51*a* and the stopping portion 25a until the pressing portion 51a presses against the bottom surface 6 of the expansion card 2. During the movement of the clamping portion 53a, the two second fasteners 60a of the pressing portion 51a are respectively moved to the two first extension parts 246a of the second adjusting slots 243a and 245a along the edges of the two second adjusting slots 243a and 245a. It is understood that the position of the pressing portion 51a in the X-axis direction can be freely adjusted because the two second adjusting slots 243a and 245a extend in the X-axis direction, thus the distance between the pressing portion 51a and the stopping portion 25a can be adjusted in accordance with the thickness of the expansion card, allowing the pressing portion 51a to press against the bottom surface of each of the expansion cards having different thicknesses.

Figure 3:
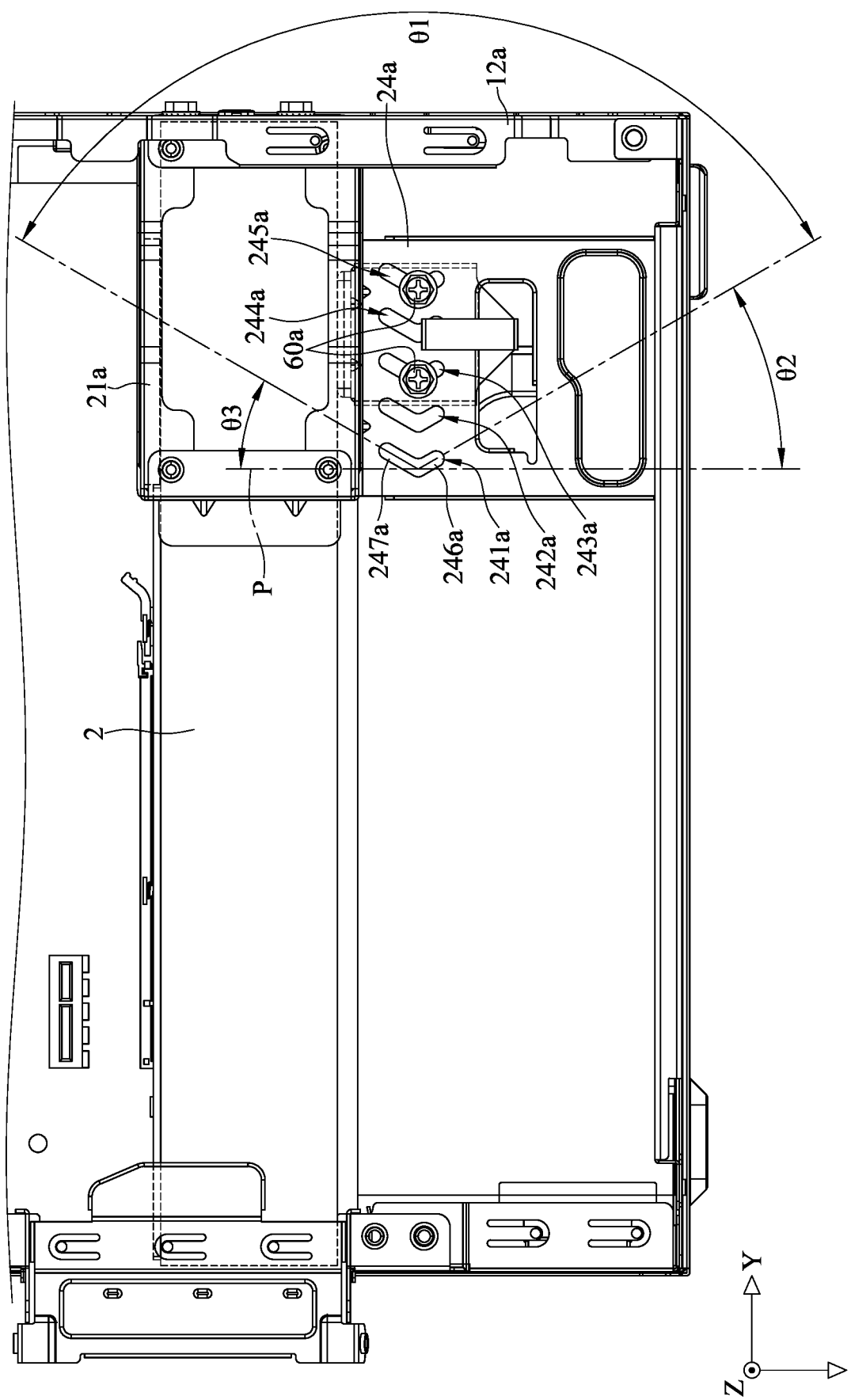
FIG. 3 is a top view of the fixing assembly and the expansion card in FIG. 1.

In addition, as shown in FIG. 3 and FIG. 7, the first extension part 246a and the second extension part 247a of each of the second adjusting slots 243a and 245a form the obtuse angle θ1, and the first extension part 246a and the second extension part 247a of each of the two second adjusting slots 243a and 245a respectively form the acute angles θ2 and θ3 with the reference line P, thus prevents the movement of the pressing portion 51a in the Y-axis direction from overly large while the pressing portion 51a is moved along the two second adjusting slots 243a and 245a. Accordingly, when the position of the pressing portion 51a is adjusted in accordance with the thickness of the expansion card, the pressing portion 51a still can press against the edge of the bottom surface of the expansion card so as to prevent an overweight expansion card from sagging and damaging the expansion slot 4 and motherboard 3.

Figure 8:
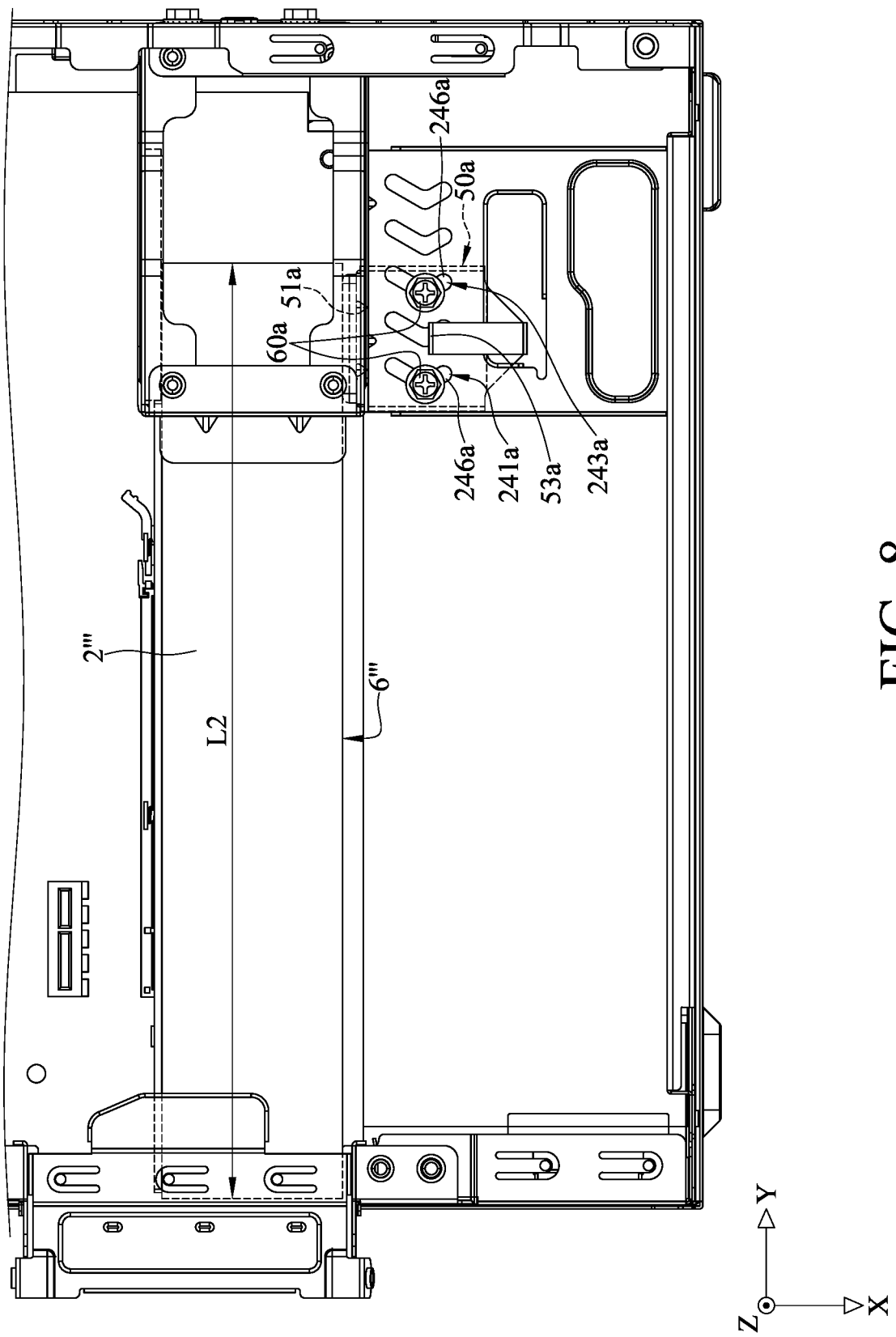
FIG. 8 is a top view of the fixing assembly in FIG. 1 when a narrower expansion card is fixed therein.

For still another example, please refer to FIG. 8, FIG. 8 is a top view of the fixing assembly in FIG. 1 when a narrower expansion card is fixed therein.

When the user attempts to install an expansion card 2'''which has a length L2 less than the length L1 of the expansion card 2 in FIG. 2, the first step is to remove the two second fasteners 60a, and then the clamping portion 53a of the second positioning component 50a is moved in the negative Y-axis direction so as to move the pressing portion 51a until the pressing portion 51a presses against the edge of the bottom surface 6''' of the expansion card 2'''. Lastly, the two second fasteners 60a are respectively disposed through the two second adjusting slots 241a and 243a and are then fixed to the pressing portion 51a of the second positioning component 50a. On the contrary, when the user attempts to replace the expansion card 2''' with the expansion card 2; that is, replacing with a longer expansion card, the first step is still to remove the two second fasteners 60a, and then the clamping portion 53a of the second positioning component 50a is moved in the positive Y-axis direction until the pressing portion 51a presses against the edge of the bottom surface 6 (e.g., as shown in FIG. 2) of the expansion card 2 so as to provide a support to the expansion card 2. As shown in FIG. 3 and FIG. 8, it is understood that the position of the pressing portion 51a can be adjusted according to the length of the expansion card because the second adjusting slots 241a-245a are arranged along the long side of the expansion card, allowing the pressing portion 51a to press against the edge of the bottom surface of each of the expansion cards having different lengths.

Figure 9:
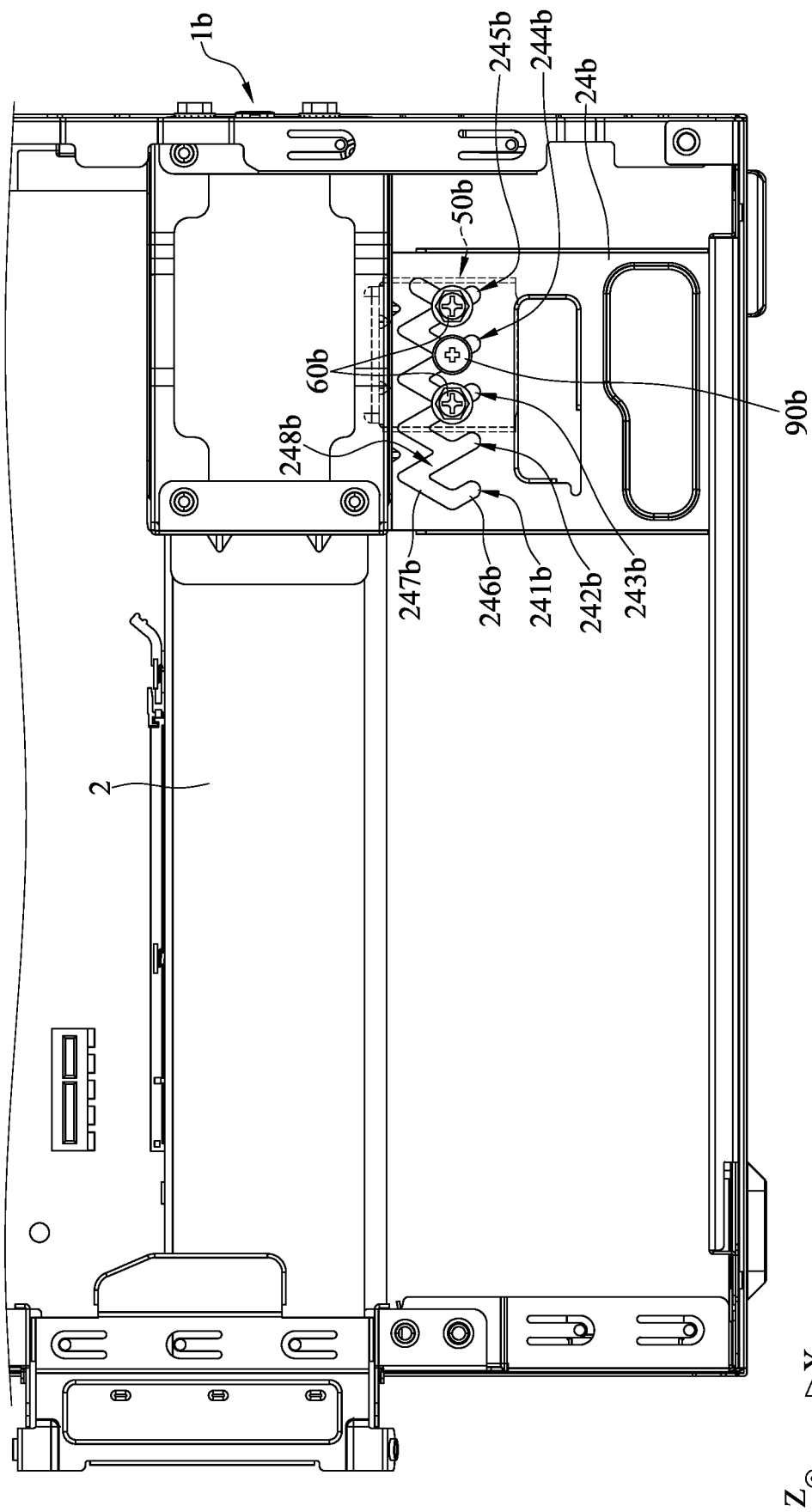
FIG. 9 is a top view of a fixing assembly according to a second embodiment of the disclosure.

In the embodiment of FIG. 1, the second adjusting slots 241a-245a are not connected to each other, but the present disclosure is not limited thereto. For example, please refer to FIG. 9, FIG. 9 is a top view of a fixing assembly according to a second embodiment of the disclosure.

In the second embodiment, a fixing assembly 1b further includes a third guiding structure 90b. The third guiding structure 90b is, for example, a step screw. A second mounting portion 24b has a plurality of second adjusting slots 241b-245b and a plurality of connecting slots 248b. Each of the second adjusting slots 241b-245b includes a first extension part 246b and a second extension part 247b, and two opposite ends of each of the connecting slots 248b are respectively connected to the first extension part and the second extension part of two of the second adjusting slots which are adjacent to each other. For example, the two opposite ends of the connecting slot 248b are respectively connected to the second extension part 247b of the second adjusting slot 241b and the first extension part 246b of the second adjusting slot 242b. In addition, the third guiding structure 90b is fixed to a second positioning component 50b and movable between two adjacent second adjusting slots through one of the connecting slots 248b.

In this embodiment, two opposite ends of each of the connecting slot 248b are respectively connected to the first extension part 246b and the second extension part 247b of two adjacent second adjusting slots, but the present disclosure is not limited thereto. In some other embodiments, two opposite ends of the connecting slot may be respectively connected to the first extension parts or the second extension parts of two adjacent second adjusting slots.

During the process of mounting the second positioning component 50b on the second mounting portion 24b, the second positioning component 50b can be pre-positioned on the second mounting portion 24b by the help of the third guiding structure 90b so as to adjust a position where the second positioning component 50b presses against the expansion card 2.

In addition, the second adjusting slots 241b-245b are connected to each other by the connecting slots 248b, thus the second positioning component 50b can be adjusted in the Y-axis direction by moving the third guiding structure 90b after the second fasteners 60b are slightly loosened. That is, it does not require to totally remove the two second fasteners 60b to move the second positioning component 50b in the Y-axis direction, thereby increasing the convenience in adjusting the second positioning component 50b.

In this embodiment, the present disclosure is not limited to the configuration of the third guiding structure 90b. In some other embodiments, the configuration of the third guiding structure may be adjusted according to actual requirements.

Figure 10:
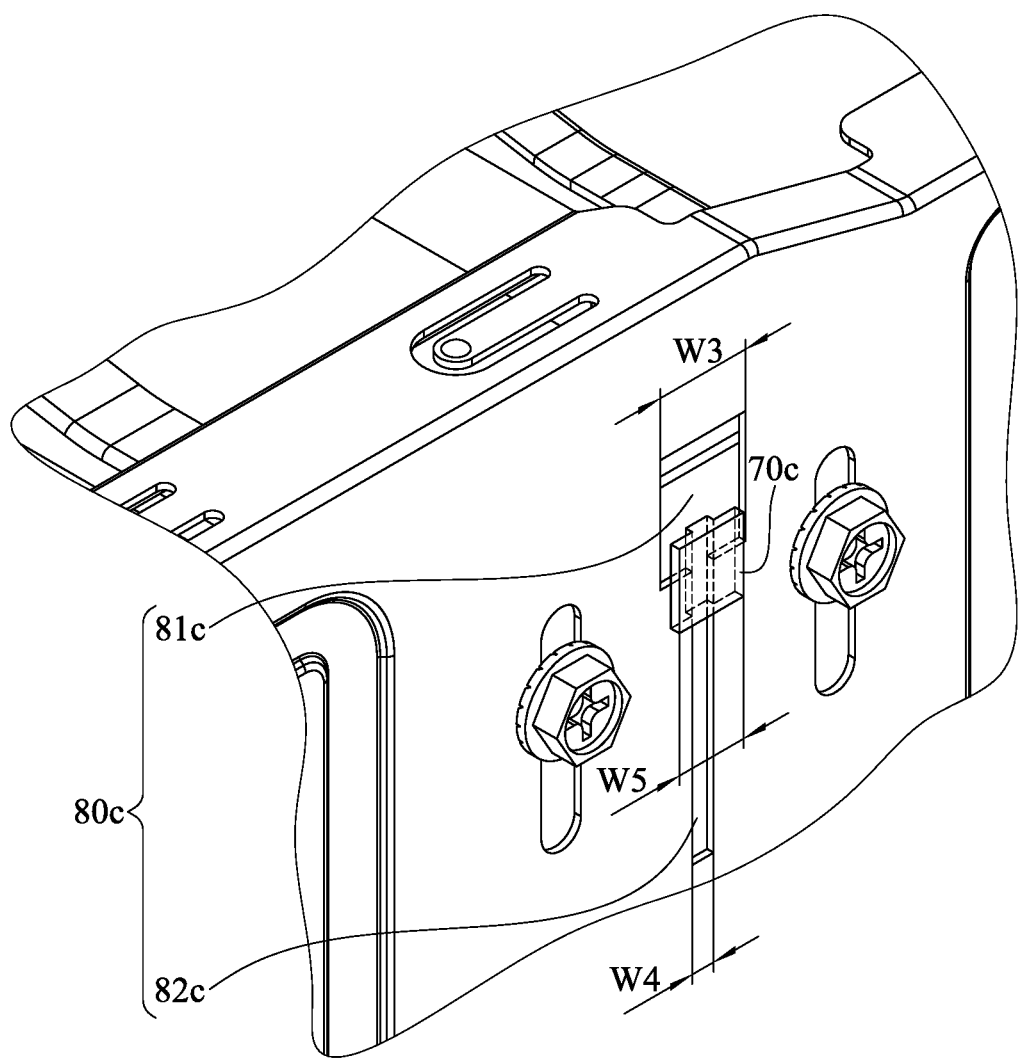
FIG. 10 is a partial perspective view of a fixing assembly according to a third embodiment of the disclosure.

In the aforementioned embodiments, the first guiding structure includes a mounting block and two guiding blocks, but the present disclosure is not limited thereto. Please refer to FIG. 10. FIG. 10 is a partial perspective view of a fixing assembly according to a third embodiment of the disclosure.

In this embodiment, a first guiding structure 70c is an engagement head, and a second guiding structure 80c includes a mounting hole 81c and a guiding slot 82c connected to each other. A width W3 of the mounting hole 81c is larger than a width W4 of the guiding slot 82c, and a width W5 of the first guiding structure 70c is smaller than the width W3 of the mounting hole 81c and larger than the width W4 of the guiding slot 82c. The first guiding structure 70c is detachably disposed through the mounting hole 81c and is movably located in the guiding slot 82c.

Figure 11:
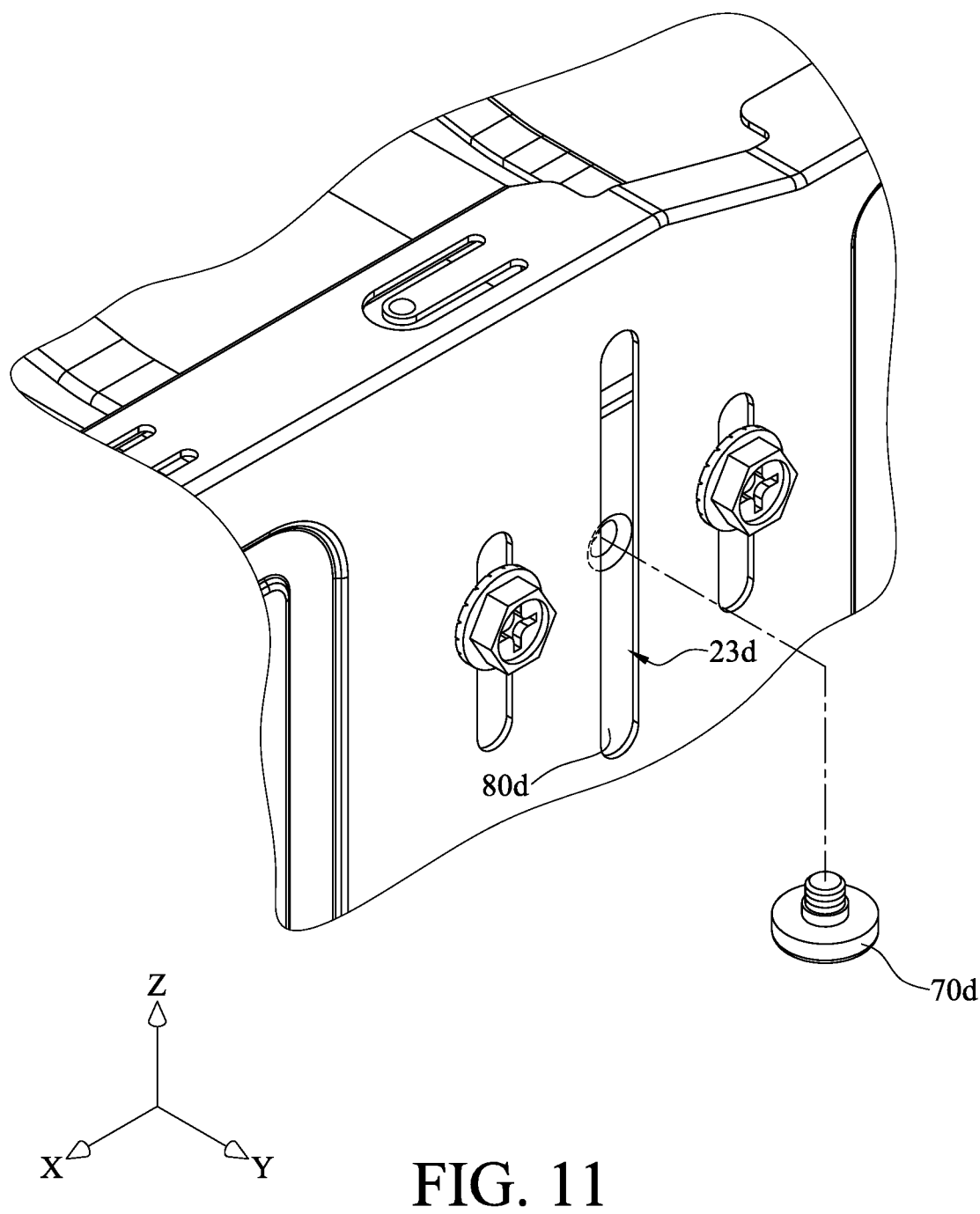
FIG. 11 is a partial perspective view of a fixing assembly according to a fourth embodiment of the disclosure.

Then, please refer to FIG. 11. FIG. 11 is a partial perspective view of a fixing assembly according to a fourth embodiment of the disclosure. In this embodiment, a first guiding structure 70d is a step screw, and a second guiding structure 80d is a slot extending in a straight direction. The first guiding structure 70*d* is disposed through the second guiding structure 80*d* and is fixed to a first mounting portion 23*d*, such that the first guiding structure 70*d* is movably located in the second guiding structure 80*d*.

Figure 12:
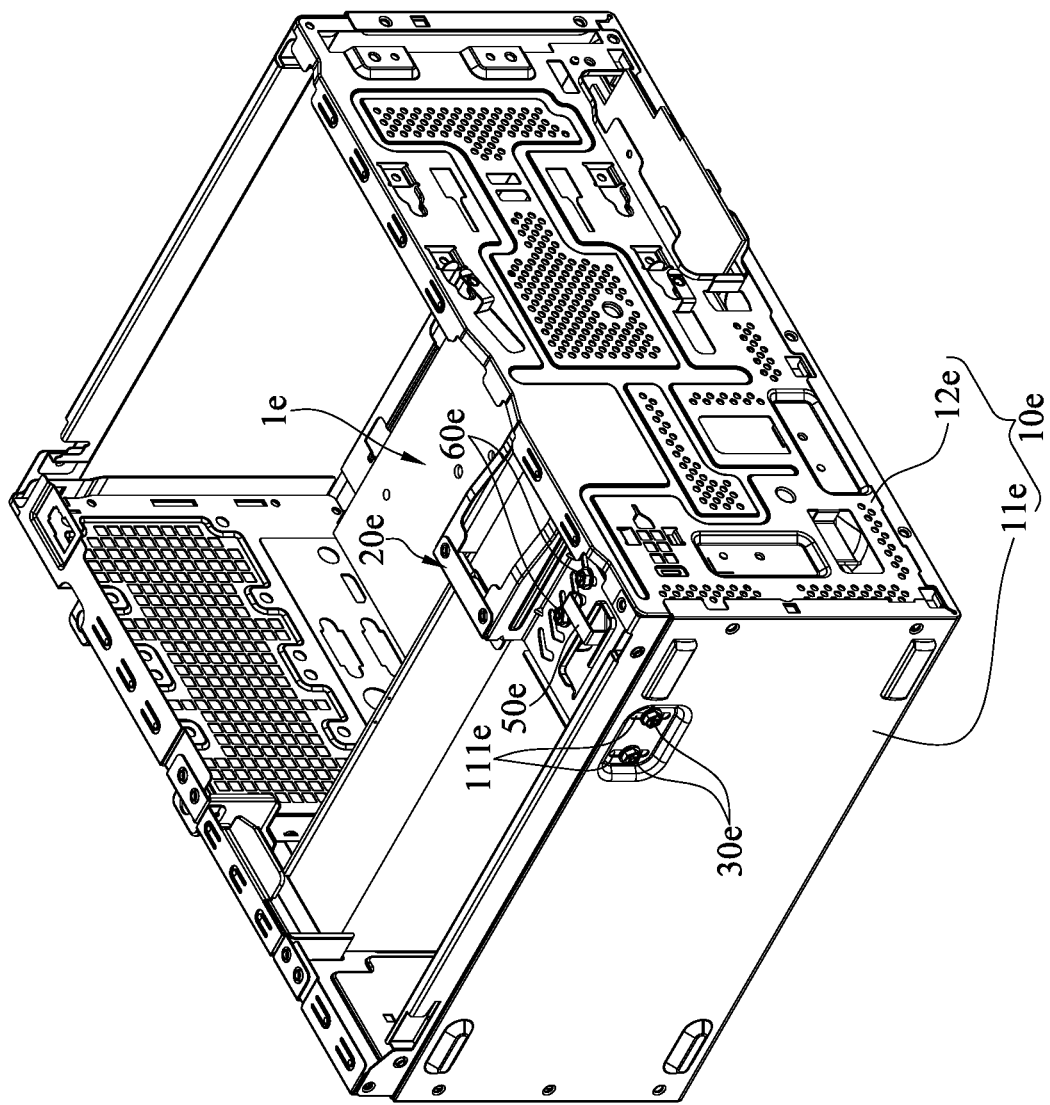
FIG. 12 is a perspective view of a fixing assembly according to a fifth embodiment of the disclosure.

In the aforementioned embodiments, the first plate and the second plate both have the first adjusting slots, but the present disclosure is not limited thereto. Please refer to FIG. 12. FIG. 12 is a perspective view of a fixing assembly according to a fifth embodiment of the disclosure.

In this embodiment, a fixing assembly 1*e* includes a casing 10*e*, a first positioning component 20*e*, two first fasteners 30*e*, a second positioning component 50*e* and two second fasteners 60*e*. The casing 10*e* includes a first plate 11*e* and a second plate 12*e* intersected each other, and an edge of the first plate 11*e* is connected to an edge of the second plate 12*e*. In this embodiment, in the first plate 11*e* and the second plate 12*e*, only the first plate 11*e* includes two first adjusting slots 111*e*, and the rest components of the fixing assembly 1*e* are similar to that of the fixing assembly 1*a* in FIG. 1 and thus are not be described in the following paragraphs. In addition, in some other embodiments, the first guiding structure and the second guiding structure shown in FIG. 2, FIG. 10 or FIG. 11 may be respectively disposed on the first mounting portion mounted on the first plate and the first plate.

Figure 13:
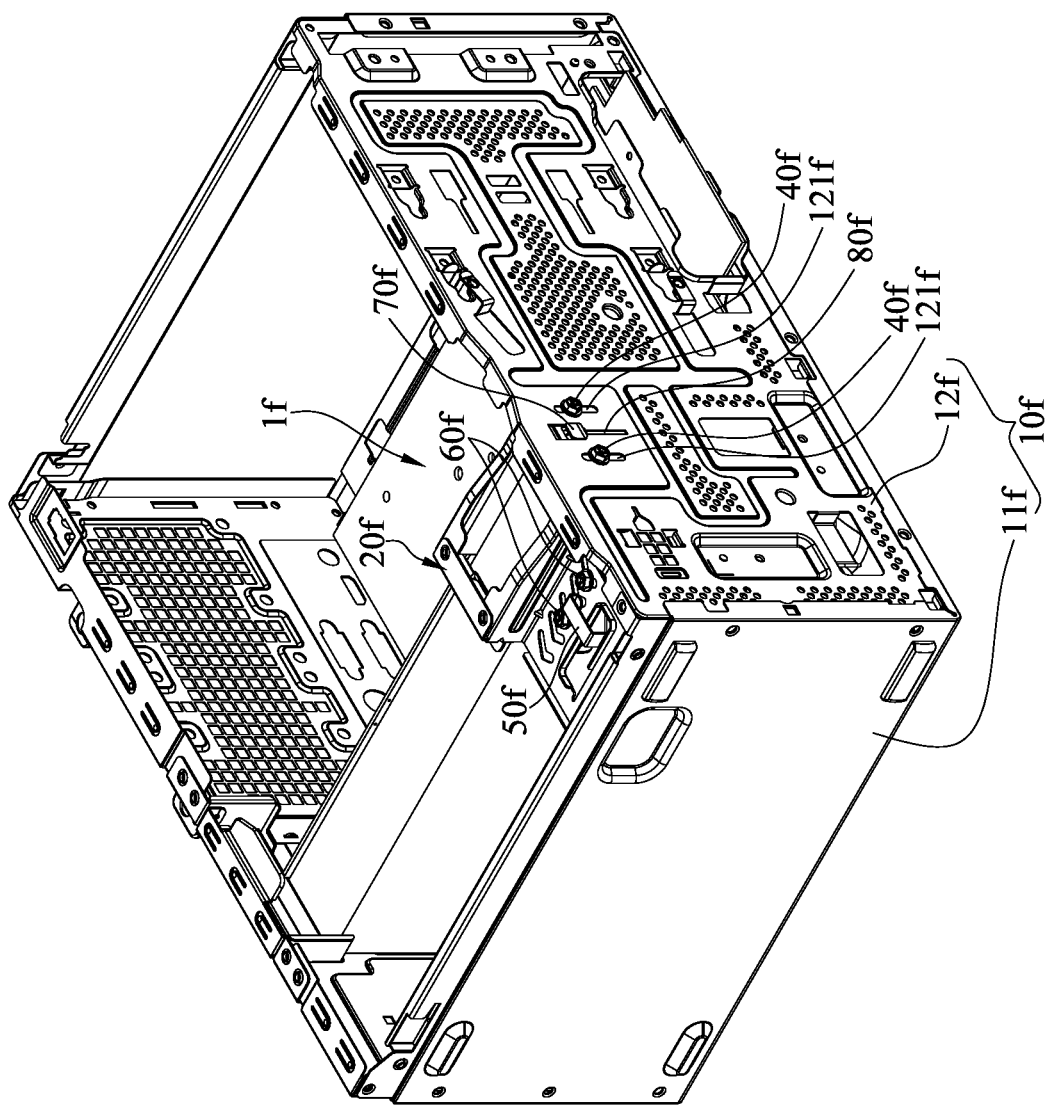
FIG. 13 is a perspective view of a fixing assembly according to a sixth embodiment of the disclosure.
Figure 13:
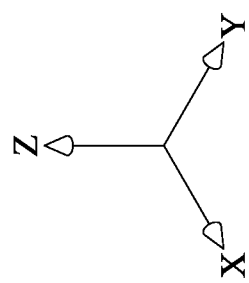

Then, please refer to FIG. 13. FIG. 13 is a perspective view of a fixing assembly according to a sixth embodiment of the disclosure.

In this embodiment, a fixing assembly 1*f* includes a casing 10*f*, a first positioning component 20*f*, two first fasteners 40*f*, a second positioning component 50*f*, two second fasteners 60*f*, a first guiding structure 70*f* and a second guiding structure 80*f*. The casing 10*f* includes a first plate 11*f* and a second plate 12*f* intersected each other, and an edge of the first plate 11*f* is connected to an edge of the second plate 12*f*. In this embodiment, in the first plate 11*f* and the second plate 12*f*, only the second plate 12*f* includes two first adjusting slots 121*f*, and the rest components of the fixing assembly 1*f* are similar to that of the fixing assembly 1*a* in FIG. 1 and thus are not be described in the following paragraphs.

Figure 14:
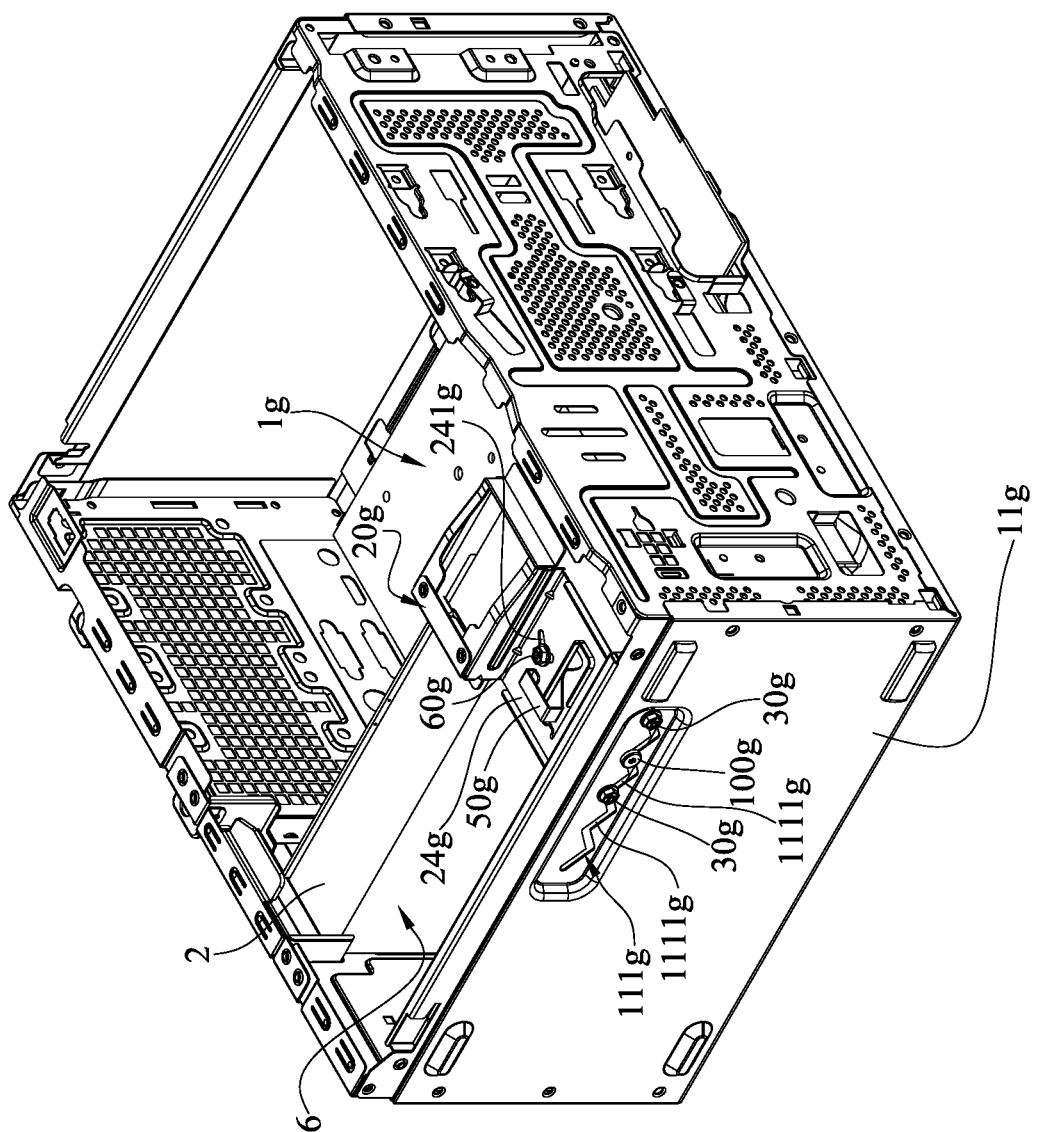
FIG. 14 is a perspective view of a fixing assembly according to a seventh embodiment of the disclosure.

Then, in the embodiment of FIG. 12, the extension directions of the two first adjusting slots 111*e* parallel the Z-axis direction, but the present disclosure is not limited thereto. For example, please refer to FIG. 14, FIG. 14 is a perspective view of a fixing assembly according to a seventh embodiment of the disclosure.

In this embodiment, a fixing assembly 1*g* further includes a guiding structure 100*g*, and the guiding structure 100*g* is a step screw. A first plate 11*g* which faces the bottom surface 6 of the expansion card 2 only has a first adjusting slot 111*g*. The first adjusting slot 111*g* is, for example, in a zigzag shape. An extension direction of the first adjusting slot 111*g* parallels to the long side of the expansion card 2. The first adjusting slot 111*g* includes a plurality of fixing portions 1111*g* connected to each other. The guiding structure 100*g* is fixed to a first mounting portion 22*a* of the first position component 20*g* (e.g., the first mounting portion 22*a* as shown in FIG. 2) and movable among the fixing portions 1111*g* so as to pre-position the first positioning component 20*g* on the first plate 11*g*. Two first fasteners 30*g* are detachably disposed through two of the fixing portions 1111*g* and then fixed to the first mounting portion of a first positioning component 20*g*.

A second mounting portion 24*g* of the first positioning component 20*g* has a second adjusting slot 241*g*. An extension direction of the second adjusting slot 241*g* is different from the extension direction of the first adjusting slot 111*g*.

A second fastener 60*g* is disposed through the second adjusting slot 241*g* and is detachably fixed to a second positioning component 50*g*.

In this embodiment, the zigzag-shaped first adjusting slot 111*g* and the extension direction of the first adjusting slot 111*g* which parallels to the long side of the expansion card 2 allows the position of the first positioning component 20*g* can be respectively adjusted in the Z-axis direction and Y-axis direction, and the second positioning component 50*g* can be adjusted in the X-axis direction and Y-axis direction, such that the fixing assembly 1*g* is suitable for expansion cards having different lengths, widths and heights.

In addition, the first adjusting slot 111*g* also allows the second positioning component 50*g* to be moved in the long side of the expansion card 2, thus the quantity of the second adjusting slot 241*g* of the second mounting portion 24*g* can be one.

According to the fixing assembly as discussed above, the lateral surface, bottom surface and the top surface of the expansion card are respectively pressed against by the positioning portion of the first positioning component, the pressing portion of the second positioning component and the stopping portion of the first positioning component, thus the fixing assembly can provide the support to the expansion card in multiple directions.

In addition, the edge of the bottom surface of the expansion card can be pressed against by the pressing portion of the second positioning component, which can further enhance the support of the pressing portion to the expansion card.

Furthermore, the first extension part and the second extension part of each second adjusting slots are inclined, thus the inclined edges of the first extension parts and the second extension parts can respectively provide support to the two second fasteners fixed to the pressing portion so as to help the pressing portion against the weight of the expansion card.

Moreover, since the extension direction of the first adjusting slot is different from the extension direction of the second adjusting slot, the positions of the positioning portion of the first positioning component and the pressing portion of the second positioning component can be adjusted, allowing the fixing assembly to accommodate expansion cards having different heights and thicknesses. Furthermore, since the second adjusting slots are arranged along the long side of the expansion card, the position of the pressing portion can be adjusted according to the length of the expansion card so as to press against the edge of the bottom surface of the expansion card, allowing the fixing assembly to accommodate expansion cards having different lengths. As such, regardless of the size of expansion card, a wide variety of expansion cards are suitable for being protected by the fixing assembly.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fixing assembly, adapted to fix an expansion card on an expansion slot of a motherboard, comprising:
    a casing;
    a first positioning component slidably disposed on the casing so that a distance between the first positioning component and the expansion slot of the motherboard is adjustable; and a second positioning component slidably disposed on the first positioning component, wherein the second positioning component and the first positioning component are configured to simultaneously press against different sides of the expansion card, and a sliding direction of the first positioning component is different from a sliding direction of the second positioning component.

2. The fixing assembly according to claim 1, wherein the first positioning component includes a positioning portion, a first mounting portion and a second mounting portion, the first mounting portion and the second mounting portion are respectively connected to different sides of the positioning portion, the second positioning component is disposed on the second mounting portion, and the first mounting portion is slidably disposed on the casing.

3. The fixing assembly according to claim 1, wherein the first positioning component includes a positioning portion, a first mounting portion and a second mounting portion connected to each other, the first mounting portion and the positioning portion are respectively connected to two opposite sides of the second mounting portion, the second positioning component is disposed on the second mounting portion, and the first mounting portion is slidably disposed on the casing.

4. The fixing assembly according to claim 3, further comprising a first fastener, and the casing having a first adjusting slot, wherein an extension direction of the first adjusting slot is the same as an inserting direction that the expansion card is inserted in the expansion slot of the motherboard, and the first fastener is disposed through the first adjusting slot and is detachably fixed to the first mounting portion.

5. The fixing assembly according to the claim 4, further comprising a first guiding structure and a second guiding structure, wherein the first guiding structure is disposed on the first mounting portion, the second guiding structure is located on the casing, an extension direction of the second guiding structure is the same as the extension direction of the first adjusting slot, and the first guiding structure is slidably mounted on the second guiding structure.

6. The fixing assembly according to claim 5, further comprising a second fastener, and the second mounting portion having a plurality of second adjusting slots, wherein the plurality of second adjusting slots are arranged in a long side of the expansion card when the expansion card is inserted in the expansion slot, an extension direction of each of the plurality of second adjusting slots is different from the extension direction of the first adjusting slot, and the second fastener is disposed through one of the plurality of the second adjusting slots and is detachably fixed to the second positioning component.

7. The fixing assembly according to claim 6, wherein each of the plurality of second adjusting slots comprises a first extension part and a second extension part, and the first extension part and the second extension part of each of the plurality of second adjusting slots form an obtuse angle.

8. The fixing assembly according to claim 6, further comprising a third guiding structure which is a step screw, and the second mounting portion having a plurality of connecting slots, wherein two opposite ends of each of the plurality of connecting slots are respectively connected to two of the plurality of second adjusting slots which are adjacent to each other, and the third guiding structure is fixed to the second positioning component and movable between two of the plurality of second adjusting slots which are adjacent to each other through one of the plurality of connecting slots.

9. The fixing assembly according to claim 3, further comprising a first fastener, and the casing having a first adjusting slot, wherein an extension direction of the first adjusting slot parallels to a long side of the expansion card when the expansion card is inserted in the expansion slot, the first adjusting slot has a plurality of fixing portions connected to each other, and the first fastener is disposed through one of the plurality of fixing portions and is detachably fixed to the first mounting portion.

10. The fixing assembly according to claim 9, further comprising a second fastener, and the second mounting portion having a second adjusting slot, wherein an extension direction of the second adjusting slot is different from the extension direction of the first adjusting slot of the casing, and the second fastener is disposed through the second adjusting slot and is detachably fixed to the second mounting portion.

11. The fixing assembly according to claim 9, further comprising a guiding structure which is a step screw, and the guiding structure is fixed to the first mounting portion and movable between the plurality of fixing portions.

12. The fixing assembly according to claim 1, wherein the first positioning component includes a positioning portion, two first mounting portions and a second mounting portion, one of the first mounting portions and the second mounting portion are respectively connected to different sides of the positioning portion, the other first mounting portion is connected to a side of the second mounting portion away from the positioning portion, the casing includes a first plate and a second plate intersected each other, and the two first mounting portions are respectively slidably disposed on the first plate and the second plate.

13. The fixing assembly according to claim 12, further comprising two first fasteners, and each of the first plate and the second plate having a first adjusting slot, wherein an extension direction of each of the two first adjusting slots is the same as an inserting direction that the expansion card is inserted in the expansion slot of the motherboard, and the two first fasteners are respectively disposed through the two first adjusting slots and are detachably fixed to the two first mounting portion.

14. The fixing assembly according to claim 13, further comprising a first guiding structure and a second guiding structure, wherein the first guiding structure is disposed on the first mounting portion which corresponds to the second plate, the second guiding structure is located on the second plate, an extension direction of the second guiding structure is the same as the extension direction of each of the first adjusting slots, and the first guiding structure is slidably mounted on the second guiding structure.

15. The fixing assembly according to claim 14, wherein the first guiding structure includes a mounting block and two guiding blocks, the two guiding blocks are respectively connected to two opposite ends of the mounting block, the two guiding blocks are connected to the first mounting portion, the second guiding structure includes a mounting hole and a guiding slot connected to each other, a width of the mounting hole is larger than a width of the guiding slot, the mounting block is detachably disposed through the mounting hole, and the two guiding blocks are slidably located in the guiding slot.

16. The fixing assembly according to claim 14, wherein the first guiding structure is a step screw, and the first guiding structure is detachably disposed through the second guiding structure and is screwed to the first mounting portion.

17. The fixing assembly according to claim 14, further comprising a second fastener, and the second mounting portion having a plurality of second adjusting slots, wherein the plurality of the second adjusting slots are arranged in a long side of the expansion card when the expansion card is inserted in the expansion slot, an extension direction of each of the plurality of second adjusting slots is different from the extension direction of each of the two first adjusting slots, and the second fastener is disposed through one of the plurality of second adjusting slots and is detachably fixed to the second positioning component.

18. The fixing assembly according to claim 17, wherein each of the plurality of second adjusting slots comprises a first extension part and a second extension part connected to each other, and the first extension part and the second extension part of each of the plurality of second adjusting slots form an obtuse angle.

19. The fixing assembly according to claim 17, further comprising a third guiding structure which is a step screw, and the second mounting portion further having a plurality of connecting slots, wherein two opposite ends of each of the plurality of connecting slots are respectively connected to two of the plurality of second adjusting slots which are adjacent to each other, and the third guiding structure is fixed to the second positioning component and movable between two of the plurality of second adjusting slots which are adjacent to each other through one of the plurality of connecting slots.

20. The fixing assembly according to claim 17, wherein the second positioning component includes a pressing portion, a connecting portion and a clamping portion, two opposite ends of the connecting portion are respectively connected to the pressing portion and the clamping portion, the pressing portion and the clamping portion extend toward a same direction, the second positioning component is disposed through the second mounting portion, the pressing portion is closer to the motherboard than the clamping portion, the pressing portion and the clamping portion together clamp the second mounting portion, the pressing portion is configured to press against the expansion card, and the second fastener is fixed to the pressing portion.

* * * * *